United States Patent
Abou-Khalil et al.

(10) Patent No.: US 8,637,353 B2
(45) Date of Patent: Jan. 28, 2014

(54) THROUGH SILICON VIA REPAIR

(75) Inventors: Michel J. Abou-Khalil, Essex Junction, VT (US); Robert J. Gauthier, Jr., Hinesburg, VT (US); Tom C. Lee, Essex Junction, VT (US); Junjun Li, Williston, VT (US); Souvick Mitra, Essex Junction, VT (US); Christopher S. Putnam, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 159 days.

(21) Appl. No.: 13/013,378

(22) Filed: Jan. 25, 2011

(65) Prior Publication Data

US 2012/0190133 A1    Jul. 26, 2012

(51) Int. Cl.
   *H01L 21/82*    (2006.01)
(52) U.S. Cl.
   USPC ............... 438/129; 438/4; 438/121; 438/123; 438/128; 257/E21.521; 257/E21.499
(58) Field of Classification Search
   USPC ................ 438/4, 21, 121, 123, 128, 129; 257/E21.499, 521
   See application file for complete search history.

(56) References Cited

U.S. PATENT DOCUMENTS

| | | | |
|---|---|---|---|
| 3,312,860 A | 4/1967 | Sturm | |
| 3,815,001 A | 6/1974 | Jamieson | |
| 4,484,087 A | 11/1984 | Mazin et al. | |
| 5,538,907 A | 7/1996 | Aronowitz et al. | |
| 5,742,083 A | 4/1998 | Lin | |
| 5,963,616 A | 10/1999 | Silfvast et al. | |
| 6,169,310 B1 | 1/2001 | Kalnitsky et al. | |
| 7,025,245 B2 | 4/2006 | Gust | |
| 7,157,787 B2 | 1/2007 | Kim et al. | |
| 7,183,648 B2 | 2/2007 | Ramanathan et al. | |
| 7,518,398 B1 | 4/2009 | Rahman et al. | |
| 2005/0174861 A1 * | 8/2005 | Kim et al. | 365/200 |
| 2009/0243046 A1 | 10/2009 | Shi et al. | |
| 2010/0013512 A1 | 1/2010 | Hargan et al. | |
| 2010/0117226 A1 | 5/2010 | Yang et al. | |
| 2010/0261318 A1 * | 10/2010 | Feng et al. | 438/132 |
| 2012/0292779 A1 * | 11/2012 | Interrante et al. | 257/774 |

OTHER PUBLICATIONS

Nan Wang, Direct measurement of charge transport through helical poly(ethyl propiolate) nanorods wired into gaps in single walled carbon nanotubes, Nanotechnology 20 (2009) 105201 (5pp).*

W. Ruythooren et al., "Cu-Cu Bonding Alternative to Solder based Micro-Bumping," 9th Electronics Packaging Technology Conference, EPTC 2007, Dec. 10-12, 2007, pp. 315-318.

(Continued)

*Primary Examiner* — Minchul Yang
(74) *Attorney, Agent, or Firm* — Wood, Herron & Evans LLP; Anthony J. Canale

(57) ABSTRACT

Methods and systems for altering the electrical resistance of a wiring path. The electrical resistance of the wiring path is compared with a target electrical resistance value. If the electrical resistance of the wiring path exceeds the target electrical resistance value, an electrical current is selectively applied to the wiring path to physically alter a portion of the wiring path. The current may be selected to alter the wiring path such that the electrical resistance drops to a value less than or equal to the target electrical resistance value.

5 Claims, 4 Drawing Sheets

(56) References Cited

OTHER PUBLICATIONS

B. P. Linder et al., "Interfacial layer optimization of high-k/metal gate stacks for low temperature processing," Microelectronic Engineering, vol. 86, No. 7-9, 2009, pp. 1632-1634.

J. U. Knickerbocker et al., "Three-dimensional silicon integration," IBM Journal of Research and Development, vol. 52, No. 6, Nov. 2008, pp. 553-569.

P. Gueguen et al., "Copper direct bonding for 3D integration," International Interconnect Technology Conference, IITC 2008, Jun. 1-4, 2008, pp. 61-63.

* cited by examiner

THROUGH SILICON VIA REPAIR

BACKGROUND

The invention relates generally to semiconductor device fabrication and, in particular, to wiring paths used for signal communication in an integrated circuit, such as through silicon vias (TSVs) used in three-dimensional chip integrations to transfer signals vertically through the stacked chip architectures.

Three-dimensional integrated circuits with through silicon vias (TSVs) have emerged as a technique for supplying vertical interconnections in the semiconductor manufacturing industry. TSV technology is of interest, for example, in creating three-dimensional chip stacks. Stacking chips in a three-dimensional chip stack shortens signal transmission distances for chip-to-chip communications and promotes a large increase in the number of inter-chip links. The improvement in electrical performance provided by a three-dimensional chip stack strongly depends on the fidelity of signal transmission through the TSVs. Because the TSV formation process is imperfect, defective TSVs can be created either before or during chip bonding. A defective TSV may have an abnormally high electrical resistance that degrades signal quality or that opens a signal path.

Despite the success of TSVs and other types of wiring paths for their intended purpose, methods and systems are needed for repairing defective wiring paths, such as TSVs used in three-dimensional chip integrations, characterized by abnormally high electrical resistance.

BRIEF SUMMARY

In an embodiment, a method is provided for altering a wiring path. The method includes determining a first electrical resistance of the wiring path and comparing the first electrical resistance of the wiring path to a target electrical resistance value. The method further includes, in response to the first electrical resistance of the wiring path exceeding the target electrical resistance value, selectively applying an electrical current to the wiring path to physically alter a portion of the wiring path such that a second electrical resistance of the wiring path following the selective application of the electrical current is less than or equal to the target electrical resistance value.

In another embodiment, a method is provided for bonding a through silicon via (TSV) to a landing pad in a stacked chip structure. The method includes capacitively charging the stacked chip structure and discharging the stacked chip structure through the TSV to form a metallurgical bond between the TSV and the landing pad.

In another embodiment, a system is provided for altering a wiring path. The system comprises a controller configured to selectively apply an electrical current to the wiring path to physically alter a portion of the wiring path such that an electrical resistance of the wiring path following the selective application of the electrical current is less than or equal to a target electrical resistance value.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Generally, embodiments of the invention are directed repair methods and systems that identifies wiring paths, such as TSVs found in three-dimensional chip integrations, with abnormally high electrical resistances in comparison with a standard or reference that includes one or more target electrical resistance values or a range of electrical resistance values, and selectively applies an electrical current that is parameterized to cause a reduction in the electrical resistance.

Figure 1:
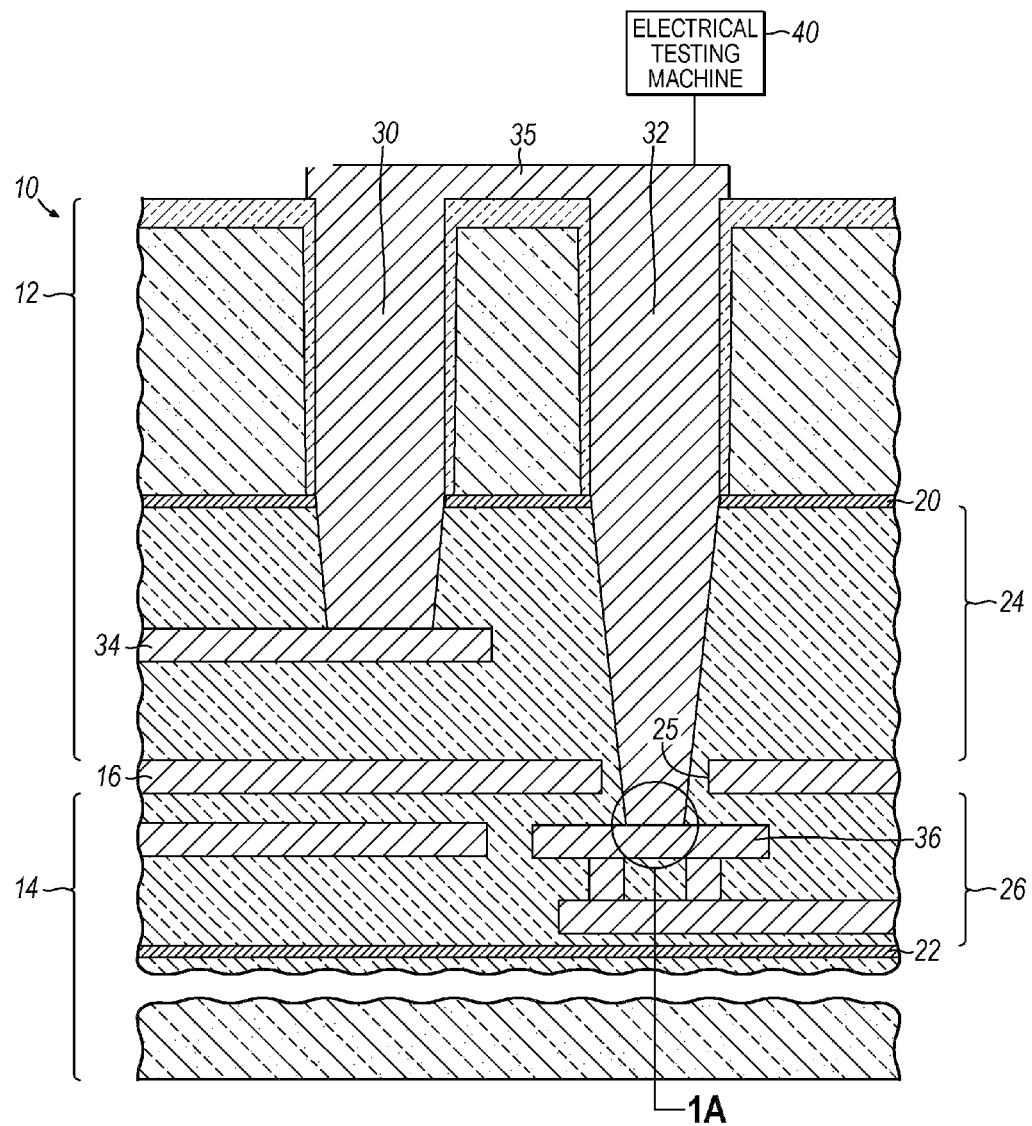
FIG. 1 is a cross-sectional view of a chip stack containing at least one defective through silicon via at an initial stage of a repair method in accordance with an embodiment of the invention in which wiring paths with abnormally elevated values of electrical resistance are identified.

With reference to FIG. 1, a stacked chip structure 10 includes a top chip 12 and a bottom chip 14 that are joined together along a bonding interface 16 to form a compact arrangement. The bonding interface 16 may be, for example, a copper-copper compression bonded region. The chips 12, 14 are fabricated at the wafer level with standard integrated circuits formed in layer 20 and layer 22, respectively, of chips 12 and 14 using front end of line (FEOL) processes such as complimentary metal-oxide-semiconductor (CMOS) or bipolar-CMOS (BiCMOS) processes. Interlevel/intralevel dielectric layers and metal features of metallization levels may then be formed in layers 24 and 26, respectively, of chips 12 and 14 using back-end-of-line (BEOL) processes. Additional chips may be added to the stacked chip structure 10 to increase the stacking beyond the representative single chip pair that includes chip 12, 14.

The TSVs 30, 32 may be used as wiring paths for providing electrical continuity (power passing, ground, I/Os, etc.) through the chip 12 between top and bottom surfaces and to the adjacent chip 14 in the stacked chip structure 10. Generally, the TSVs 30, 32 may be fabricated by deep reactive ion etching or laser drilling deep vias into the material of the wafer used to form the chip 12, electrically insulating the deep vias, lining each via with a conductive liner and filling each via with a metal (e.g., copper, tungsten), thinning the wafer from the back side until the via metal is exposed, and optionally depositing a metal film to form a back-side-metal (BSM) for electrical contact.

A through silicon via (TSV) 30 extends partially through the thickness of chip 12 and lands on a landing pad 34 of chip 12. Another through silicon via (TSV) 32 extends completely through the thickness of chip 12, through an opening 25 in the bonding interface 16 coupling chip 12 with chip 14, and partially through the thickness of chip 14 to land on a landing pad 36 of chip 14. The TSVs 30, 32 may be connected at the exterior surface of chip 12 by a TSV bar 35. The TSVs 30, 32 may be among a large number of TSVs that penetrate through one or both of the chips 12, 14 as wiring paths. For example, the total number of TSVs in the stacked chip structure 10 may exceed one thousand (1000). All of the TSVs are typically bonded to their corresponding bond pads by a single common process operation.

In an initial stage of the process flow for the repair process, an in-line electrical testing machine 40 may be used to determine the electrical resistance of the TSVs, including TSV's 30, 32, of the stacked chip structure 10. The electrical test may be fulfilled by a four-point measurement probe applied to measure electrical resistance as understood to a person having ordinary skill in the art. An elevated value of electrical resistance may be an indication that a particular TSV, such as TSV 32, may be defective following fabrication and joining with the landing pad 36. For example, an unusually high resistance for any particular TSV, such as TSV 32, that exceeds a given electrical resistance threshold may indicate a defective bond with the landing pad 36 or other another type of problem with the metallization resulting in a defect that causes the measurement of an elevated electrical resistance.

Figure 1A:
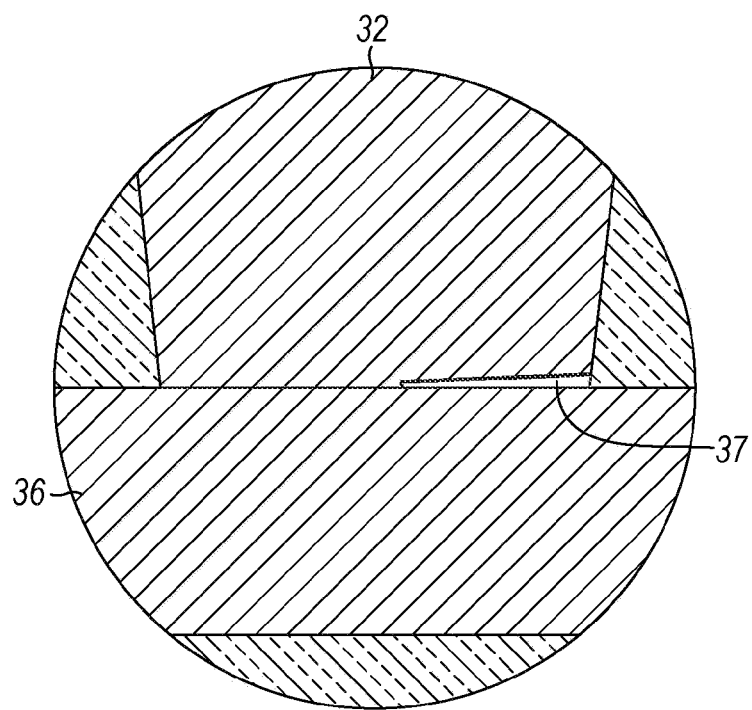
FIG. 1A is a detailed view of a portion of FIG. 1.

As best shown in FIG. 1A, the TSV 32 may have failed to fully land on the landing pad 36, when formed, so that a small void 37 is present between the TSV 32 and the landing pad 36. The absence of metal in the void 37 that provides a local region of relatively high electrical resistance. As a result, the value of electrical resistance measured for TSV 32 is elevated relative to a given threshold value. The void 37 represents an exemplary type of defect providing elevated electrical resistance. Other types of non-illustrated defects may result elevated electrical resistance that is correctable using the process flow of the embodiments of the invention.

Figure 2A:
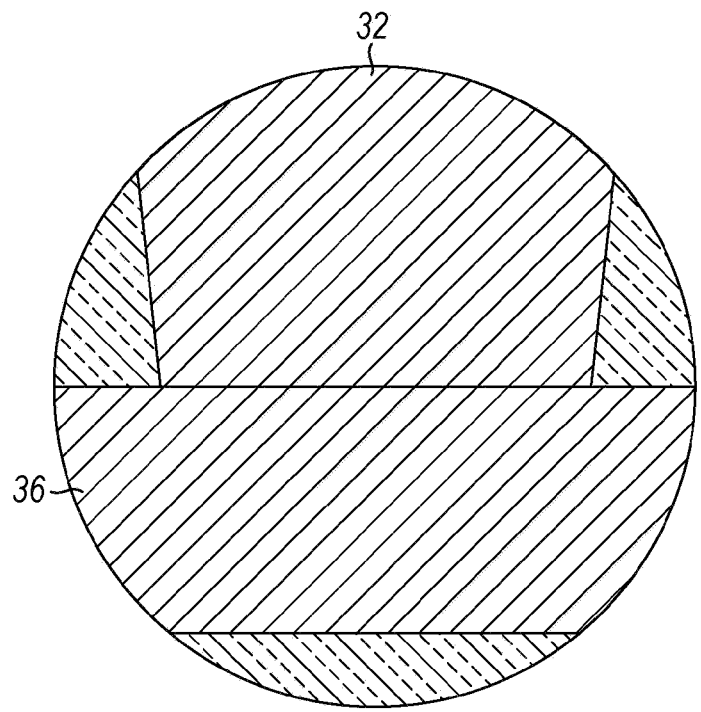
FIG. 2A is a detailed view similar to FIG. 1A of a portion of FIG. 2.
Figure 2:
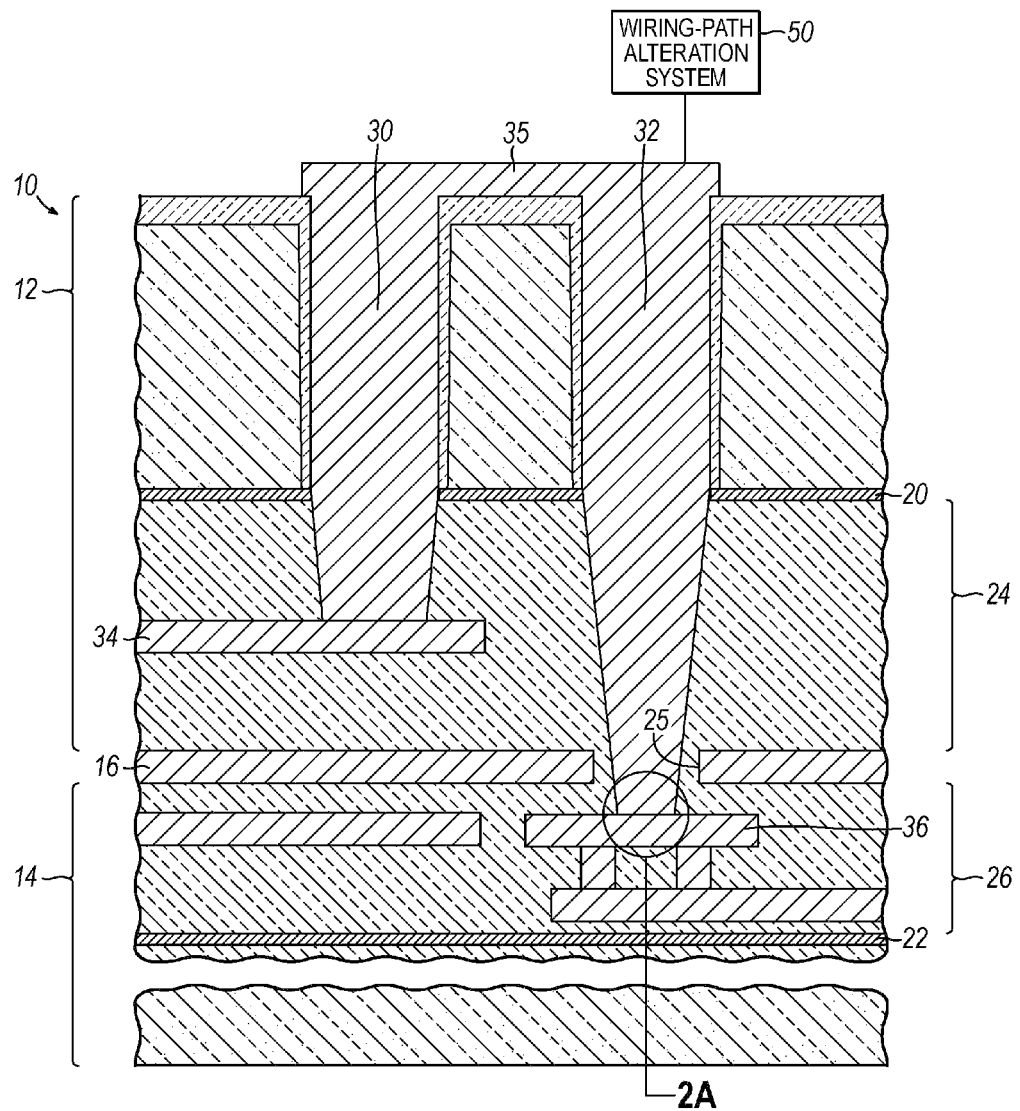
FIG. 2 is a cross-sectional view similar to FIG. 1 at a subsequent fabrication stage of the repair method in which wiring paths with elevated electrical resistance values are subjected to a procedure that reduces the electrical resistance.

With reference to FIG. 2, the measurements of electrical resistance determined by the in-line electrical testing machine 40 can be used to identify defective wiring paths (e.g., TSVs). In one embodiment, the electrical resistances measured by the electrical testing machine 40 in FIG. 1 are communicated to a wiring-path alteration system 50 and system 50 compares the electrical resistance value of each TSV (e.g., TSV 30, 32) with a reference value of electrical resistance setting a standard or target for acceptability. The measured electrical resistance may be considered to be unacceptable and the TSV in need of repair conditioned upon the measured electrical resistance of the TSV (e.g., either TSV 30 or TSV 32), when compared with the target electrical resistance value, being greater than to the target electrical resistance value.

If the comparison indicates that the measured electrical resistance of any particular TSV is less than or equal to the target electrical resistance value, then the particular TSV does not require repair. If the measured electrical resistance of any particular TSV is high enough, then the TSV may be considered to be unrepairable and excluded from the repair process.

As a numerical example of conditions or logic for a representative decision process to identify defective wiring paths, the target electrical resistance value of a wiring path represented by a TSV may be considered acceptable if equal to 10 ohms or less, and the measured electrical resistance of a wiring path may be considered to be unacceptable if the measured electrical resistance is greater than 10 ohms but less than 1000 ohms. A wiring path with a measured electrical resistance higher than 1000 ohms may be considered to be unrepairable.

In an alternative embodiment, these comparisons to identify wiring paths in need of repair may be made at the in-line electrical testing machine 40 and communicated to the wiring-path alteration system 50. In another alternative embodiment, an entirely separate system may receive the electrical resistance values from the in-line electrical testing machine 40, compare each with the target value for the electrical resistance to identify wiring paths of elevated resistance, and then communicate those identifications to the wiring-path alteration system 50.

In response to the electrical resistance of the wiring path represented by a TSV (e.g., TSV 32) exceeding the target electrical resistance value and being repairable, the wiring-path alteration system 50 applies an electrical current to, for example, TSV 32. The electrical resistances supplied from the electrical testing machine 40 to the wiring-path alteration system 50 may be mapped by TSV location so that a spatial reference on chip 12 is associated with each electrical resistance measurement. The electrical current is parameterized to physically alter at least a portion of the metal constituting TSV 32 sufficiently and non-destructively such that the electrical resistance of the TSV 32 is at or below the target electrical resistance value. The altered portion of the TSV 32 is typically the high electrical resistance portion, which in this instance includes the void 37 proximate to the landing pad 36.

The stacked chip structure 10 is capacitively charged by the wiring-path alteration system 50 to a high voltage in a range of, for example, 100 volts to 500 volts. In a representative embodiment, the stacked chip structure 10 is coupled with a voltage source of the wiring-path alteration system 50 that is operated to apply a potential difference to capacitively charge the stacked chip structure 10.

The charge applied to the stacked chip structure 10 is temporarily stored and subsequently discharged by the wiring-path alteration system 50. However, the discharge is configured such that a current pulse is directed through only the defective TSV (e.g., TSV 32). As a result of the localized discharge, the defective TSV (e.g., TSV 32) is self-heated by the current pulse to a temperature above a melting point of the metal comprising the TSV. In particular, the high electrical resistance portion of TSV 32 experiences the highest temperature rise from Joule heating. As a result, the metal comprising the high electrical resistance portion of the defective TSV melts and reflows to repair the high electrical resistance portion. For example, the metal in the vicinity of the void 37 representing the high electrical resistance portion of TSV 32 may melt and flow to fill the void 37. The elimination of the void 37 lowers the electrical resistance of the previously high electrical resistance portion of the TSV. As best shown in FIG. 2A, the degree of physical contact between TSV 32 and landing pad 36 are increased after the non-destructive repair process is used to fill the void 37 with metal by a mass transport mechanism. As a result of the repair process, the electrical resistance of the TSV 32 is reduced to an acceptable level in comparison with a target electrical resistance value.

The repair process of FIG. 2 may be repeated to repair each defective TSV identified during testing by the in-line electrical testing machine 40 in FIG. 1 to have an elevated electrical resistance. The ability to repair defective TSV's provides a solution to the yield problem that may be observed in the manufacture of stacked chip structures. Devices in the integrated circuits in layers 20, 22 are not damaged during the repair process because all I/O pads are protected at the ESD level such that any discharge occurs through ESD devices.

Figure 3:
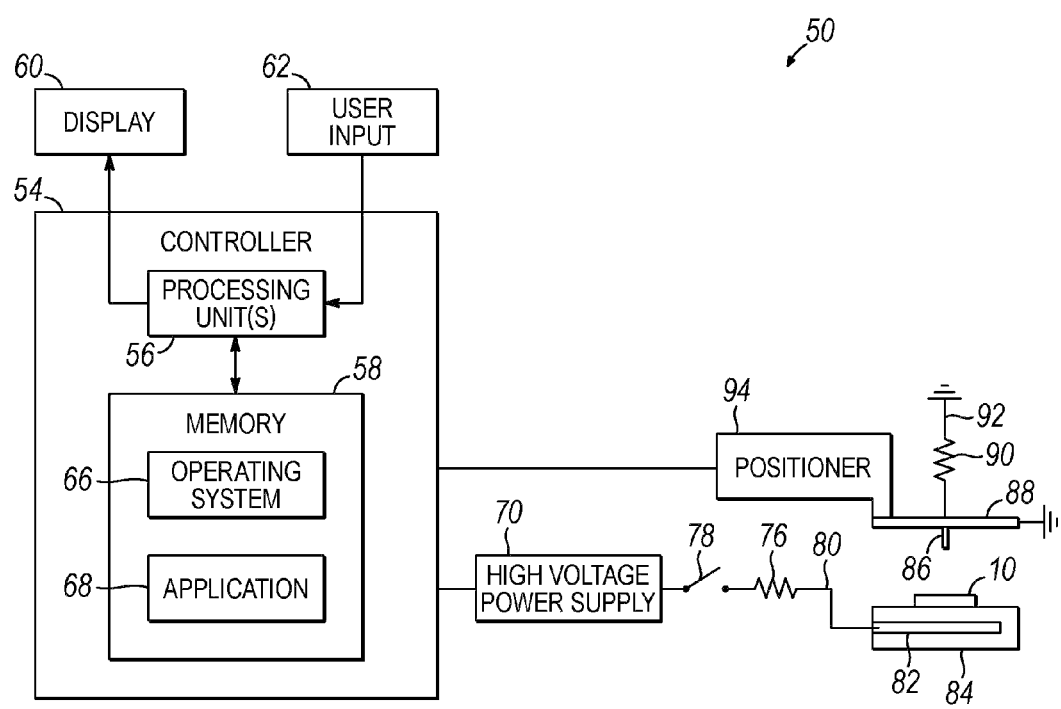
FIG. 3 is a diagrammatic view of a system for use in practicing a portion of the repair method.

With reference to FIG. 3, a representative embodiment of the wiring-path alteration system 50 is shown that may be used to practice the non-destructive repair process of wiring paths, such as TSV's, as described above. The wiring-path alteration system 50 includes a controller 54 that controls the repair process for the stacked chip structure 10, as well as other operations of the wiring-path alteration system 50. The controller 54 of the wiring-path alteration system 50 is supplied with data relating to the electrical resistance measurements performed on the TSVs 30, 32 and may determine the TSVs characterized by elevated electrical resistance, or be supplied with an identification of the TSVs of elevated electrical resistance by the in-line electrical testing machine 40 (FIG. 1).

The controller 54 typically includes at least one processing unit 56 communicating with a memory 58. The processing unit 56 may be one or more microprocessors, micro-controllers, field-programmable gate arrays, or ASICs, while memory 58 may include random access memory (RAM), dynamic random access memory (DRAM), static random access memory (SRAM), flash memory, and/or another digital storage medium. As such, memory 58 may be considered to include memory storage physically located elsewhere in controller 54, e.g., any cache memory in the at least one processing unit 56, as well as any storage capacity used as a virtual memory, e.g., as stored on a mass storage device, a computer, or another controller coupled to controller 54 by way of a network (not shown). In specific embodiments, the controller 54 may be a computer, computer system, server, disk array, or programmable device such as a multi-user computer, a single-user computer, a handheld device, a networked device, or other programmable electronic device and further include a display and user input device (neither shown). As such, controller 54 may include a display 60 and user input 62 to display information to a user and receive information from the user, respectively. Similarly, memory 58 may include an operating system 66 to run program code, or "application," 68 to control the wiring-path alteration system 50 and to cause repair of the wiring paths.

The routines executed to implement the embodiments of the invention, whether implemented as part of the operating system 66 or a specific application, component, program, object, module or sequence of instructions executed by at least one processing unit 56 will be referred to herein as "computer program code," or simply "program code." The program code typically comprises one or more instructions that are resident at various times in various memory and storage devices in the controller 54, and that, when read and executed by one or more processing units 56 of the controller 54 cause that controller 54 to perform the steps necessary to execute steps, elements, and/or blocks embodying the various aspects of the embodiments of the invention.

The electrical testing machine 40 (FIG. 1) may include a controller similar to controller 54 for controlling the measurement of the electrical resistances of the wiring paths and, optionally, for identifying those wiring paths of elevated resistance if not identified by controller 54 from the measured values of electrical resistance.

To generate the voltage signals, the wiring-path alteration system 50 may include at least one high voltage power supply unit 70 operable to produce a high voltage pulse in response to program code executed by the controller 54, user interaction with the controller 54, and/or other commands received at the controller 54. The high voltage power supply 70 is coupled through a resistor 76 and a switch 78 by a transmission path 80 with a field charging electrode 82 inside an insulating fixture 84. The resistor 76 is configured to raise a potential at the field charging electrode 82 to a desired level suitable for capacitively charging the stacked chip structure 10. The switch 78 can be operated to connect the field charging electrode 82 to electrical ground after the stacked chip structure 10 has been capacitively charged.

The transmission path used to charge the stacked chip structure 10 is accomplished through the bottom chip 14. When the switch 78 is closed by the wiring-path alteration system 50, an electrical connection is established between the high voltage power supply 70 and the field charging electrode 82. As used herein, "electrical connections" include any connection, couple, or coupling that may be used to carry an electrical signal, electrically float, or otherwise provide a connection to a ground path, a ground plane, a ground signal, or earth. The stacked chip structure 10 is capacitively charged across the electrical connection to a high voltage in a range of, for example, 100 volts to 500 volts.

The wiring-path alteration system 50 further includes a probe pin 86 that projects from a ground plate 88 but is electrically isolated from the ground plate 88. The probe pin 86 is electrically connected by a transmission path 90 to ground. The transmission path 90 may be the core of a coaxial cable and the probe pin 86 may be connected with the core of the coaxial cable through a resistor 92. The probe pin 86 is supported from a positioner 94, which is in communication with the controller 54. Positioner 94 has a construction familiar to a person having ordinary skill in the art and typically includes motion stages, drive motors for moving the motion stages, and circuitry used by the controller 54 for activating the drive motors with control signals.

The probe pin 86 is moved by the positioner 94 under the control of the controller 54 relative to the stacked chip structure 10 and into contact with one of the defective TSVs (e.g., TSV 32) such that an electrical connection is established. The resulting discharge to ground from the closing of the circuit path on contact is confined to the defective TSV (e.g., TSV 32). The resulting flow of a high electrical current of a magnitude through the defective TSV is sufficient to cause the non-destructive self-heating that promotes repair. Following discharge, the controller 54 of the wiring-path alteration system 50 causes the positioner 94 to move probe pin 86 to break the electrical connection between the TSV 32 and the probe pin 85.

Program code executing on the controller 54 is configured to operate the switch 78 for the high voltage power supply 70 and the positioner 94. The controller selectively opens and closes the switch 78 to charge the capacitively charging the stacked chip structure 10. The map of TSV locations is used as a data file by the program code executing on the controller 54 to systematically move the probe pin 86, after causing the stacked chip structure 10 to be charged, into contact each TSV characterized by elevated electrical resistance to cause a discharge affecting repair and then breaking the electrical connection after repair is affected.

The wiring paths in the representative embodiment are depicted as TSVs in a stacked chip structure. However, the wiring path may comprise any non-TSV metal feature or conductor as appreciated by a person having ordinary skill in the art. For example, the wiring path may be any other type of metal feature found in the BEOL of a chip including, but not limited to, interconnects formed in a BEOL wiring level, a BEOL inductor, BEOL coplanar waveguides or transmission lines, etc.

In an alternative embodiment, after a stacked chip structure is formed, the wiring-path alteration system 50 may be modified such that the high voltage power supply 70 can be used to supply an electrical current pulse to the probe pin 86. The current pulse may be utilized to fix the contact resistance between a TSV and a complementary landing pad by applying an electrical current pulse from the probe pin 86 to the TSV contacted by the probe pin 86. Alternatively, an electrical current pulse may be applied from an on-chip source to establish or fix the contact resistance of the TSV and landing pad. However, the landing pad contacting the TSV must be grounded which permits omission of the portion of the process that charges the stacked chip structure 10 through the bottom chip 14. The procedure relies upon electrical resistance measurements, as described herein, as a criterion or condition to identify specific TSVs for contact resistance fixing.

In another alternative embodiment, during a manufacture stage of a stacked chip structure, the wiring-path alteration system 50 may be used to charge a bottom chip or wafer and then direct a discharge through a specific TSV in order to join that TSV with its complementary landing pad. In this instance, the procedure is not intended to repair a defective TSV but to establish the original electrical connection between the TSV and landing pad. The TSV and the landing pad are heated to a temperature exceeding a melting point of the metals comprising the TSV and the landing pad and, upon cooling, a metallurgical bond is formed. The procedure provides an alternative to the conventional process that relies on thermal bonding in a high temperature chamber to join TSVs with their respective landing pads. The metallurgical bond preferably forms an interface that is free of voids, oxide films, or discontinuities. If partial discontinuities exist that elevate the electrical resistance, then the wiring-path repair process described herein may be employed to identify TSVs with elevated electrical resistance in comparison with a reference value and to affect repair of those identified TSVs to lower the electrical resistance to an acceptable value.

In another alternative embodiment, during a manufacture stage of a stacked chip structure at the wafer level, the wiring-path alteration system 50 may be used to charge the bottom wafer or chip, which is then discharged through a specific TSV with the objective of improving the contact resistance of the TSV. This alternative embodiment may be used to systematically improve the uniformity of contact resistance across all TSVs of a stacked chip structure and relies upon electrical resistance measurements, as described herein, as a criterion or condition for identifying specific TSVs that need physical alternation or modification.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of repairing a wiring path in a stacked chip structure, the wiring path including a through silicon via (TSV) and a landing pad coupled with the TSV, the method comprising:
    determining a first numerical value for an electrical resistance of the wiring path;
    comparing the first numerical value for the electrical resistance of the wiring path to a target electrical resistance value ranging from 10 ohms to 1000 ohms;
    if the first numerical value for the electrical resistance of the wiring path is between 10 ohms and 1000 ohms, capacitively charging the stacked chip structure to a voltage in a range of 100 volts to 500 volts; and
    contacting the TSV with a grounded probe to discharge the voltage from the stacked chip structure through the TSV and the landing pad to the grounded probe so that a portion of the wiring path having a defect is heated to a temperature exceeding a melting point of a metal comprising the wiring path.

2. The method of claim 1 wherein the wiring path is considered unrepairable if the first numerical value for the electrical resistance of the wiring path is greater than 1000 ohms.

3. The method of claim 2 further comprising:
    designating the wiring path for exclusion from repair.

4. The method of claim 1 wherein the wiring path is considered not defective if the first numerical value for the electrical resistance of the wiring path is less than 10 ohms.

5. The method of claim 4 further comprising:
    designating the wiring path for exclusion from repair.

* * * * *